(12) United States Patent
Wang

(10) Patent No.: US 6,351,229 B1
(45) Date of Patent: Feb. 26, 2002

(54) DENSITY-MODULATED DYNAMIC DITHERING CIRCUITS AND METHOD FOR DELTA-SIGMA CONVERTER

(75) Inventor: Binan Wang, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/654,712

(22) Filed: Sep. 5, 2000

(51) Int. Cl.$^7$ ............................................... H03M 3/00
(52) U.S. Cl. ........................................ 341/143; 341/131
(58) Field of Search .................................. 341/143, 131

(56) References Cited

U.S. PATENT DOCUMENTS

| | | | |
|---|---|---|---|
| 5,144,308 A | 9/1992 | Norsworthy | 341/131 |
| 5,745,061 A | 4/1998 | Norsworthy et al. | 341/131 |
| 5,835,038 A | 11/1998 | Nakao et al. | 341/131 |
| 6,150,969 A | * 11/2000 | Melanson | 341/143 |

* cited by examiner

Primary Examiner—Peguy JeanPierre

(74) Attorney, Agent, or Firm—W. Daniel Swayze, Jr.; W. James Brady; Frederick J. Telecky, Jr.

(57) ABSTRACT

A delta sigma modulator system includes a delta sigma modulator (9) including a summing circuit (3) having a first input connected to receive an input signal (2), loop filter circuitry (5) having an input coupled to an output of the summing circuit (3), and comparator circuitry (22) having an input coupled to an output of the loop filter circuitry (5) and also having an output coupled to an output (23) of the delta sigma modulator (9). The density of the dither is adjusted in accordance with changes in the magnitude of the input signal. This is accomplished by performing a coarse digital filtering of an output signal (23) produced by the delta-sigma modulator (9), wherein noise present in the output signal (23) produced by the delta sigma modulator (9) causes a probability distribution of the occurrence of pulses constituting a filtered output signal (25) produced by the coarse filtering. A dither disable signal is produced if the filtered output signal (25) is not within a first threshold window. The dither disable signal is utilized to enable a pseudo-random sequence signal in order to produce a non-zero dither signal level. The non-zero dither signal is applied to the second input of the second summing circuit (10). The coarse digital filtering produces the probability distribution so as to cause gradual transitions in the density of pulses produced by the coarse filtering.

21 Claims, 7 Drawing Sheets

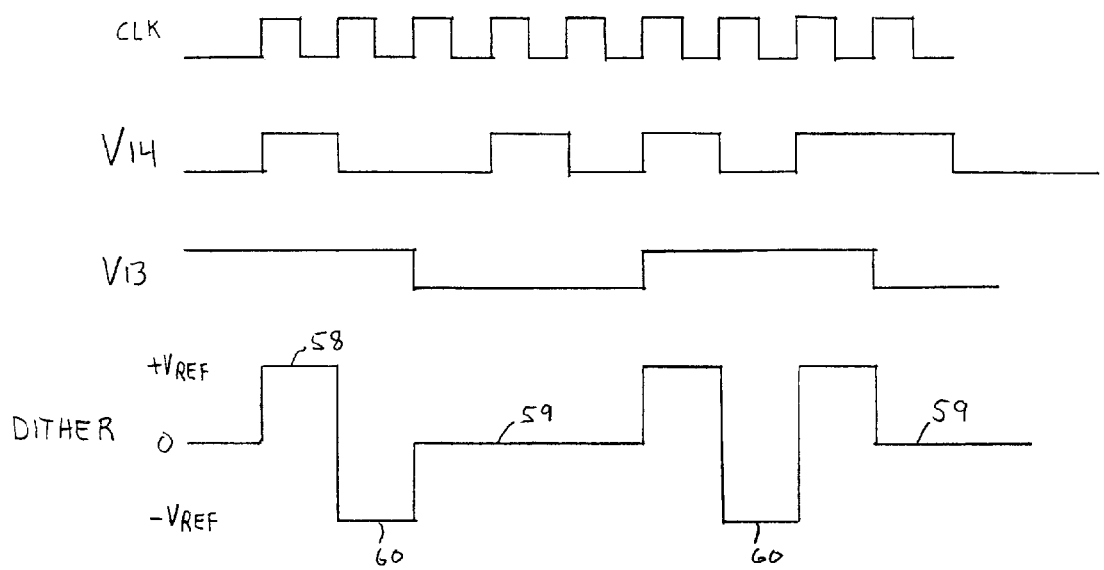

DENSITY-MODULATED DYNAMIC DITHERING CIRCUITS AND METHOD FOR DELTA-SIGMA CONVERTER

BACKGROUND OF THE INVENTION

By way of background, delta sigma modulators are known to inherently generate tones, due to the characteristics of delta-sigma modulator feedback loops. The tones of a delta-sigma modulator can be thought of as low frequency envelopes of the serial stream of digital pulses produced at the output of the delta sigma modulator. The frequency and level of such tones depend on the architecture of the delta sigma modulator and the level of the input signal applied to it. Although the tone levels can be very low, i.e., many dB below the noise level, the tones nevertheless can be very detrimental to the performance of the delta sigma modulator. For example, in an audio application, a tone produced in the signal band by a delta-sigma modulator typically in the audible frequency range of 20 Hz to 20 kHz can be detected by human ears, even if the level of the tone is many dB below the noise level. Such tones are in the baseband of the delta sigma modulator, and are likely to be detrimental to its performance in audio frequency applications even if the magnitude of the in-band tone is many dB below the noise level of the output signal produced by the delta sigma modulator. This is because many humans are extremely sensitive to in-band audio frequency tones, especially if the tones persist at particular frequencies. If the tone generated at the output of the delta sigma modulator includes energy that is clustered around certain frequencies, sensitive humans can hear the tone and be annoyed by it, even though the magnitude of the tone is well below the noise level of the output signal produced by the delta sigma modulator.

One known solution to the problem of in-band DC-dependent tones produced by delta sigma modulators is to add a DC offset at or near the input of the delta sigma modulator, wherein the DC offset magnitude is large enough to shift the in-band tone out of the baseband. One prior art reference disclosing this technique is commonly assigned U.S. Pat. No. 5,835,038 by Nakao et al. However, for this technique to be effective, an AC input signal applied to the delta sigma modulator can not have a DC component that might counteract or cancel an introduced opposite-polarity DC offset. If the input signal includes a DC component, the input signal must be AC coupled to the input terminal of the delta sigma modulator, which usually is inconvenient. For a delta sigma modulator having a differential input, there are a number of additional reasons why it would be desirable to have a better approach to breaking up tones or shifting them out of the baseband than just adding a DC offset or a DC dither. For example, an input signal of magnitude close to the DC offset but of opposite polarity could bring a tone that has been shifted out of the baseband back into the baseband. As another example, a very slowly-varying AC signal can have instantaneous values of magnitude comparable to the DC offset end of opposite polarity to the DC offset. This condition creates a short-duration tone.

Another approach to the problem of in-band DC-dependent tones produced by a delta sigma modulator is to introduce dither in order to de-correlate the modulator output, i.e., to break up the tones. The magnitude of a dither signal needs to reach a certain level in order to accomplish the objective of breaking up tones generated by the delta sigma modulator. However, when the dither signal has the needed level and at the same time the input signal applied to the delta sigma modulator has a large magnitude, the combination can cause instability in the delta sigma modulator. That is, a large amplitude dither signal may cause instability in the delta sigma modulator when an integrating loop of the delta sigma modulator is receiving a large magnitude input signal. To avoid this, it may be necessary to restrict the input signal range of the delta sigma modulator, which is undesirable because restricting the input signal range may limit the signal-to-noise ratio that can be achieved, especially for a high order delta sigma modulator wherein the higher the order of a delta sigma modulator, the smaller the usable input signal range must be to avoid instability problems. Typically, simple addition of dither can reduce the input range of a delta sigma modulator by a large amount, especially in a high order delta sigma modulator which would inherently already have a small stable input range.

In order to ensure loop stability in a delta sigma modulator while maintaining effective dither, the dither has to be applied "dynamically". The known concept of dynamic dithering is to apply maximum dithering when the magnitudes of the input signals applied to the delta sigma modulator are small, because this is when undesirable tones appear in the baseband and there is a strong need for dithering to "break up" the tones. However, when the magnitude of the input signal gets larger, the magnitude of the dithering signal is reduced in order to prevent the combination of the large magnitude input signal and the large magnitude dynamic dither signal from causing instability in the delta sigma modulator. The closest prior art dynamic dithering techniques involve use of a multi-bit level estimator/quantizer and a multi-level dither injector. These multi-level circuits are necessary to cause the magnitude of the dither signal to change gradually.

"Prior art" FIGS. 1 and 2 herein illustrate such known adaptive or dynamic dithering techniques. Basically, what is accomplished using these techniques is to estimate the level of the input signal applied to the delta sigma modulator, either by directly estimating the level of the input signal as shown in prior art FIG. 2, or by indirectly estimating the input level by directly estimating the output level produced by the delta sigma modulator as shown in prior art FIG. 1. Prior art FIG. 1 illustrates a conceptual design that would be difficult to implement because of various practical difficulties, especially latency in the digital filtering circuitry thereof. Use of the first-stage destination filter compounds this difficulty because by definition the destination filter is clock and updated at a divided-down frequency, extending the duration of the latency. Prior art FIG. 2 corresponds to either FIG. 1 or FIG. 2 of prior art U.S. Pat. No. 5,745,061 by Norsworthy et al., entitled "Method of Improving the Stability of a Sigma-Delta Modulator Employing Dither". Also see U.S. Pat. No. 5,144,308 by Norsworthy. Note that the dynamic dithering systems of prior art FIGS. 1 and 2 control the magnitude of the dynamic dither signal.

The techniques utilized in both of the above mentioned references therefore arbitrarily the determine the boundaries of "transition points" at which the dither magnitude is changed, were and therefore cause the overall noise level at the output of the delta sigma modulator to undergo sudden increases across the arbitrary boundaries. The dynamic dithering techniques of both prior art FIGS. 1 and 2 require costly multi-bit DACs and also require costly multi-bit quantizers or ADCs to control of the levels produced by the estimators, wherein the number of bits of the multi-bit DAC must be commensurate with a number of levels produced by the nonlinear quantizer, and additional circuitry is required to control the DAC.

Furthermore, in order for such prior dynamic dithering techniques to be effective in decorrelating the modulator output (i.e., in breaking up the tones), the amplitude of the dither signal has to be quite large. The need to use multiple-bit DACs and multiple-bit ADCs or quantizers to control the dither in the above prior art delta sigma modulators with dynamic dither circuitry may add substantially to the cost of the delta sigma modulators.

Various pseudo-random sequence generators are known to those skilled in the art. For example, the pseudo-randomization of the chopper clock signal frequency effectively "spreads" chopper clock noise energy throughout the frequency spectrum, and thereby reduces the intermodulation between the amplifier input signal and the chopper clock signal which causes a side image of the input signal.

There remains an unmet need for an inexpensive delta sigma modulator that avoids production of in-band tones, especially audio tones which are discernible to and annoying to users of audio equipment utilizing the delta sigma modulator, without degrading the performance of the delta sigma modulator.

SUMMARY OF THE INVENTION

Accordingly, it is an object of the invention to provide a delta sigma modulator which does not produce discernible DC-dependent tones in the output signal produced by the delta sigma modulator.

It is another object of the invention to provide a delta sigma modulator with dither that eliminates discernible DC-dependent tones in the output signal produced by the delta sigma modulator without using multi-bit analog-to-digital converters or quantizers and/or multi-bit digital-to-analog converters and control circuitry associated therewith.

It is another object of the invention to break up tones in the signal band of a delta sigma modulator without compromising the stability of an integrating loop in the delta sigma modulator.

It is another object of the invention to avoid discontinuity in the operation of a delta sigma modulator due to abrupt changes in the magnitude of a dither signal introduced into the delta sigma modulator.

It is another object of the invention to avoid discontinuity in the operation of a delta sigma modulator due to abrupt changes that occur in the magnitude of a dither signal introduced into the delta sigma modulator especially as in the prior art dynamic dithering systems shown in prior art FIGS. 1 and 2 herein.

Briefly described, and in accordance with one embodiment thereof, the invention provides a delta sigma modulator system and method which involve a delta sigma modulator (9) including a summing circuit (3) having a first input connected to receive an input signal (2), loop filter circuitry (5) having an input coupled to an output of the summing circuit (3), and comparator circuitry (22) having an input coupled to an output of the loop filter circuitry (5) and also having an output coupled to an output (23) of the delta sigma modulator (9). The density of the dither is adjusted in accordance with changes in the magnitude of the input signal. This is accomplished by performing a coarse digital filtering of an output signal (23) produced by the delta-sigma modulator (9), wherein noise present in the output signal (23) produced by the delta sigma modulator (9) causes a probability distribution of the occurrence of pulses constituting a filtered output signal (25) produced by the coarse filtering. A dither disable signal is produced if the filtered output signal (25) is not within a first threshold window. The dither disable signal is utilized to enable a pseudo-random sequence signal in order to produce a non-zero dither signal level. The non-zero dither signal is applied to a summing node of the loop filter circuitry (5) the. The coarse digital filtering produces the probability distribution so as to cause gradual transitions in the density of pulses produced by the coarse filtering.

BRIEF DESCRIPTION OF THE DRAWINGS

FIG. 8 is a timing diagram useful explaining the operation of the delta sigma modulator circuit 1B in FIG. 3B.

DETAILED DESCRIPTION OF THE PREFERRED EMBODIMENTS

Figure 3A:
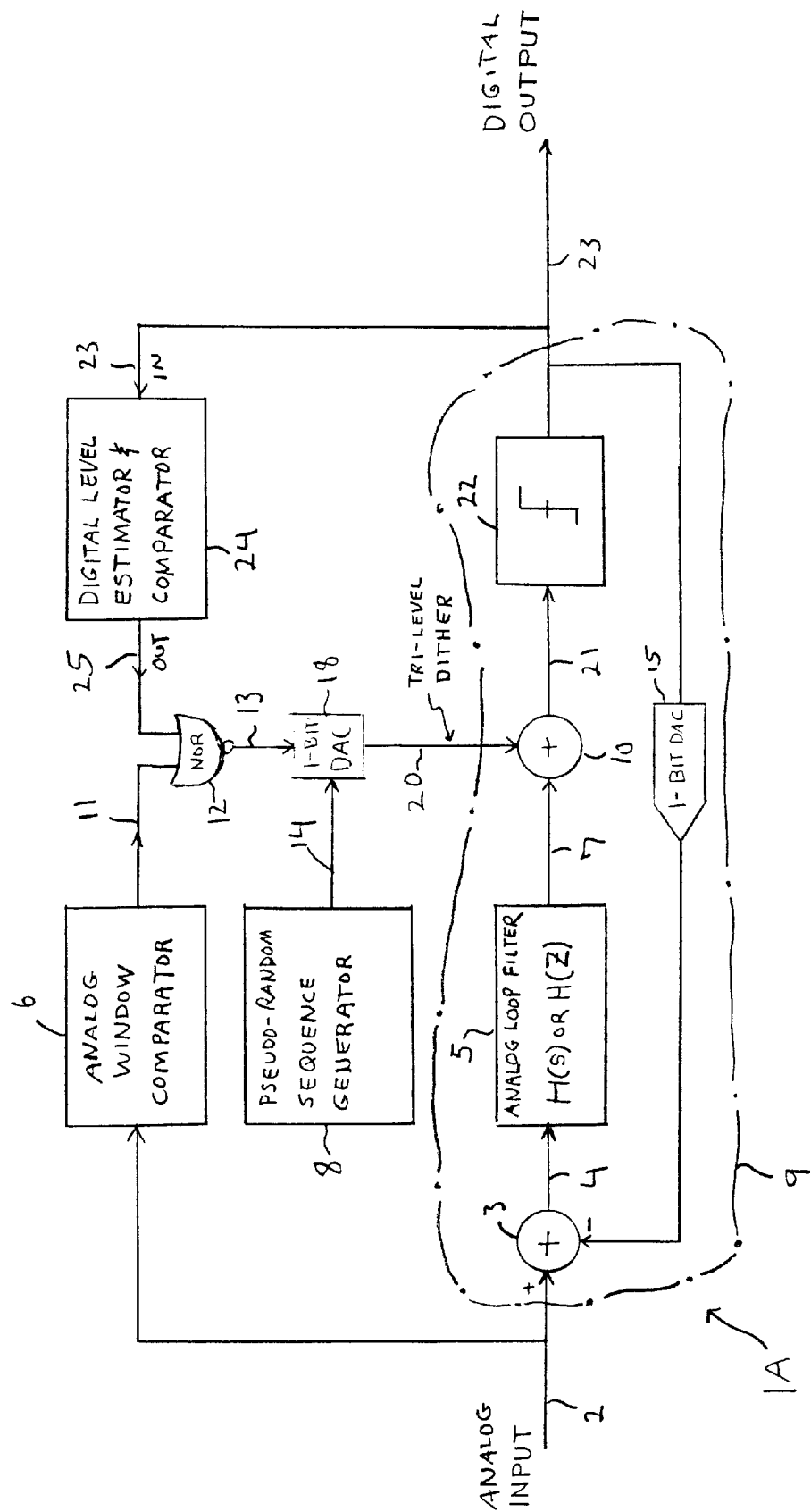
FIG. 3 is a block diagram of a delta-sigma modulator including a dynamic dither circuit according to the present invention.

FIG. 3A discloses a delta sigma modulator system 1A which includes a "conventional delta sigma modulator" 9 and additional dynamic density-modulated dither circuitry according to the present invention. It should be noted that the diagram of FIG. 3A is intended to encompass both differential and single-ended delta sigma modulators. Conventional delta sigma modulator 9 includes an analog summer 3, an analog filter 5, an analog summer 10, and a comparator 22. The rest of the circuitry in FIG. 3A constitutes the density-modulated dither circuitry of the present in the invention.

Delta sigma modulator system 1A receives an analog input signal on input conductor 2. Input conductor 2 is connected to the (+) input of analog summer 3 and also to the input of an analog window comparator circuit 6. Delta sigma modulator 9 produces a serial digital output stream on digital output bus or conductor 23, which is connected to the output of comparator 22. (Digital output bus 23 could be a multi-bit bus producing a parallel output, rather than a single bit bus producing a one bit serial output stream.) Output conductor 23 also is connected to the input of a "digital level estimator and comparator circuit" 24 and also to the input of a one-bit DAC 15, the output of which is connected to the (−) input of analog summer 3. (DAC 15 could be a multi-bit DAC.) The output of analog summer 3 is connected to the input of an analog filter circuit 5 having a transfer function H(s) or H(z) and producing an output signal on output conductor 7. (Analog summer 3 actually simply schematically represents a summing node in a preferred embodiment of the invention.) Analog window comparator 6 produces an output signal on conductor 11 indicative of whether the magnitude of the analog input signal on input conductor 2 is within a range defined by analog window comparator 6. That output signal is applied by conductor 11 to one input of a NOR gate 12, the other input of which is connected by conductor 25 to the output signal produced by digital level estimator and comparator circuit 24. Therefore, if either the analog input signal on input conductor 2 is outside of the threshold window of analog window comparator 6, or if the digital output signal on output conductor 23 is outside of the threshold window of a comparator within digital level estimator and comparator circuit 24, then the level of the dither added to delta sigma modulator 9 should be reduced to zero. (Note that NOR gate 12 can be any logic gate circuit that produces a signal representative of the logical OR of two or more input signals.)

The output of NOR gate 12 is connected by dither enable/disable conductor 13 to one input of a one-bit DAC 18 that is capable of producing three levels of dither. One-bit DAC 18 has another input connected by conductor 14 to the output of a pseudo-random sequence generator circuit 8, which can be any of a number of known pseudo-random sequence generators. The output 13 of NOR gate 12 therefore produces a dither enable/disable signal V13 that controls the amount and polarity of the dither signal 20 introduced to analog modulator 9. Specifically, dither enable/disable signal V13 causes one-bit DAC 18 to apply to one of three possible levels of a tri-level dither signal 20 to one input of an analog summer 10. The other input of analog summer 10 is connected by conductor 7 to the output of analog filter 5. The output of analog summer 10 is connected by conductor 21 to the input of quantizer 22, the output of which produces the one-bit digital output stream on output conductor 23.

Figure 7A:
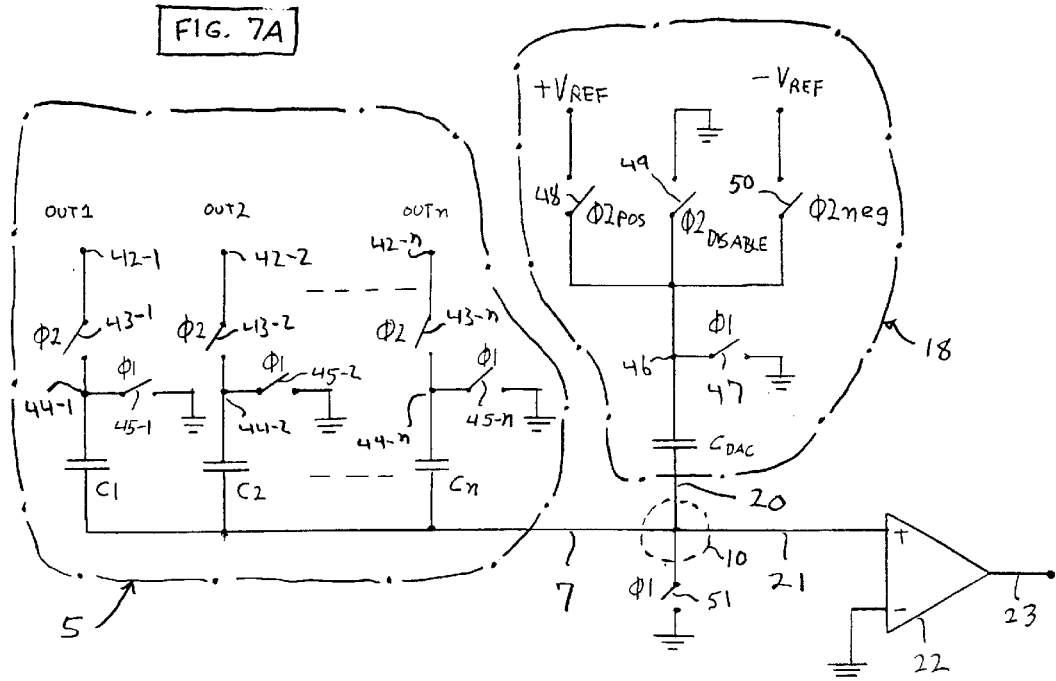
FIG. 7A is a schematic diagram of the one-bit DAC 18 in FIG. 3A.

Referring next to FIG. 7A, the circuitry within dashed line 5 represents a practical implementation of a portion of analog loop filter 5 in FIG. 3A. The circuitry within dashed line 18 illustrates a practical implementation of 1-bit DAC 18 in FIG. 3A.

Within dashed line 5 in FIG. 7A, the signals OUT1,2 . . . n carried by conductors and 42-1,42-2 . . . 42-n are the output signals produced by the various integrator stages (not shown) of analog loop filter 5, and are coupled by switches 43-1,43-2 . . . 43-n to conductors 44-1, 44-2, and 44-n, respectively. Conductor 44-1 is connected to one terminal of capacitor C1 and to one of switch 45-1, the other of which is connected to ground. Similarly, conductor 44-2 is connected to the upper terminal of capacitor C2 and to one terminal of switch 45-2, the other terminal of which is connected to ground, and conductor 44-n is connected to the upper terminal of capacitor Cn and to one terminal of switch 45-n, the other terminal of which is connected to ground. The lower terminals of capacitors C1,C2. . .Cn are connected to conductor 7. Capacitors C1,2 . . . n determine the coefficients associated with analog loop filter 5. Switches 43-1,2 . . . .n are controlled by $\phi 2$, and switches 45-1,2 . . . n are controlled by $\phi 1$.

One-bit DAC 18 in FIG. 7A includes capacitor $C_{DAC}$, switch 47 coupled between conductor 46 and ground, and three switches 48, 49, and 50 selectively coupling conductor 46 to $+V_{REF}$, ground, and $-V_{REF}$, respectively. Switches 48, 49, and 50 are controlled by $\phi 2_{POS}$, $\phi 2^{DISABLE}$, and $\phi 2^{NEG}$, respectively. Capacitor $\phi_{DAC}$ is coupled between conductor 46 and summing node 10, which performs the function of analog summer 10 in FIG. 3A. Conductor 7, which is the output of analog loop filter 5, is connected to summing node 10. Summing conductor 10 also is connected by conductor 21 to the (+) input of comparator 22. Switch 51, which is controlled by $\phi 1$, is coupled between summing node 10 and ground, and is shared by one-bit DAC 18 and analog loop filter 5.

Figure 4:
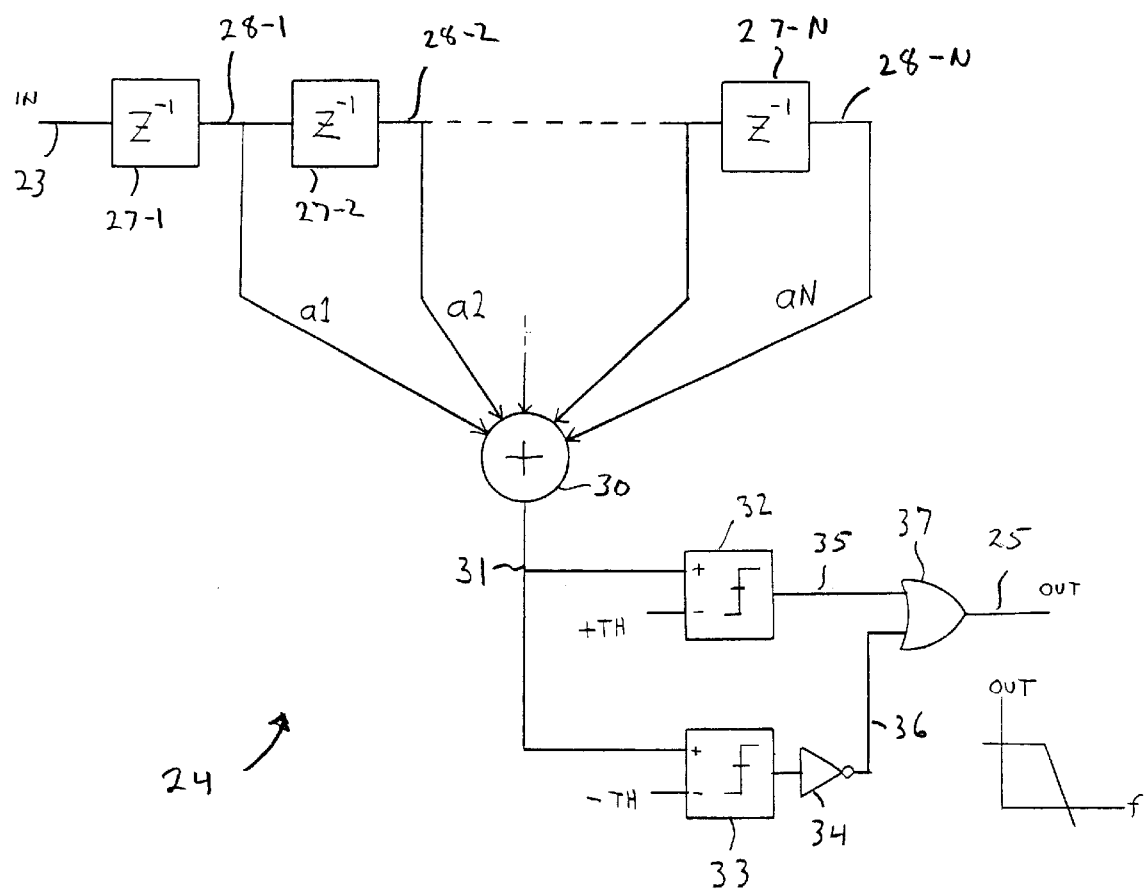
FIG. 4 is a block diagram of the digital level estimator and comparator circuit 24 of FIG. 3.
Figure 7B:
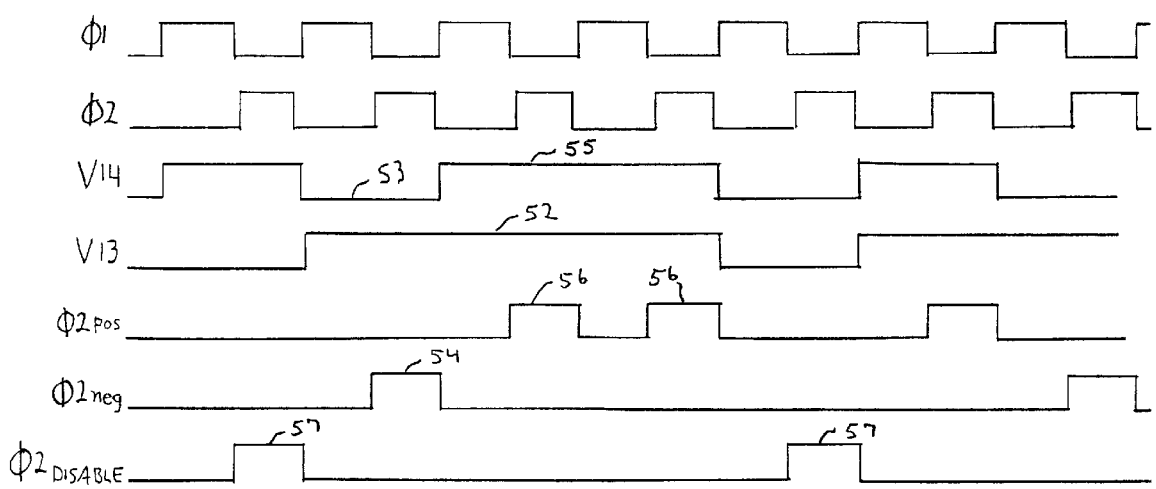
FIG. 7B is a timing diagram useful in explaining the operation of the one-bit DAC in FIG. 7A.

The waveforms of signals $\phi 2_{POS}$, $\phi 2_{DISABLE}$ and $\phi 2_{NEG}$ are shown in FIG. 7B, and are generated by level estimator and comparator circuit 24 of FIGS. 3A and 4 by ANDing$\phi 2$ clock and the dither information, so if the dither information is at a low level no dither is injected into the delta sigma modulator, but if the dither information is a high-level, then either a positive or negative dither level is injected into the delta sigma modulator.

Specifically, the waveforms illustrated in FIG. 7B include non-overlapping clock signals $\phi 1$ and $\phi 2$, the pseudo-random sequence signal V14 produced on conductor 14, the dither enable/disable signal V13 produced on conductor 13 by NOR gate 12, and the three control signals $\phi 2_{POS}$, $\phi 2_{NEG}$, and $\phi 2_{DISABLE}$ produced from the dither polarity of the pseudo-random generator signal V14 and dither enable/disable signal V13. Specifically, if dither enable/disable signal V13 is at a high level as indicated by reference numeral 52 in FIG. 7B, and if at the same time pseudo-random sequence signal V14 is at a low level as indicated by numeral 53, then digital level estimator and comparator circuit 24 causes $\phi 2_{NEG}$ to be high as indicated by numeral 54 during $\phi 2$, causing switch 50 to close during $\phi 2$. If dither enable/disable signal V13 is at the high level indicated by numeral 52 and if at the same time pseudo-random sequence signal V14 is at a high level as indicated by numeral 55, then digital level estimator and comparator circuit 24 causes $\phi 2_{POS}$ to be at a high level as indicated by numerals 56 during $\phi 2$, causing switch 48 to close during $\phi 2$. If dither enable/disable signal V13 is low during $\phi 2$, then digital level estimator and comparator circuit 24 causes $\phi 2_{DISABLE}$ to be high as indicated by numeral 57 during $\phi 2$, causing switch 49 to be closed during $\phi 2$. Thus, one of the three switches 48, 49 and 50 will be turned on during every $\phi 2$ pulse, causing a dither signal level of $+V_{REF}$, zero, or $-V_{REF}$ to be injected into summing node 10 during every $\phi 2$ cycle to produce the above described tri-level dither signal on conductor 20.

The delta-signal modulator circuit 1A of FIG. 3A and FIG. 7A can be conveniently implemented using conventional CMOS technology.

A differential implementation of delta-sigma modulator circuit IA of FIG. 3A would include a duplicate balanced switched capacitor circuit essentially identical to the one shown in FIG. 7A, and would also include a second summing conductor that would be connected to the (−) input of comparator 22 (instead of that input being connected to ground as shown). The upper switched capacitor circuit (i.e., the one shown in FIG. 7A) would have all of the switches such as 43-1,2 . . . n coupled to the outputs of the various integrating stages of an upper analog loop filter clocked by $\phi 2_{POS}$. The corresponding lower switch capacitor circuit (not shown) would have all of the outputs of the integrating loops of a lower analog loop filter clocked by $\phi 2_{NEG}$.

It should be understood that the tri-level dither signal on conductor 20 can be readily injected into various other points of the delta sigma modulator 9 then into summing node 10. For example, the dither signal could be modified somewhat and injected into a midpoint of the analog loop filter.

Figure 3B:
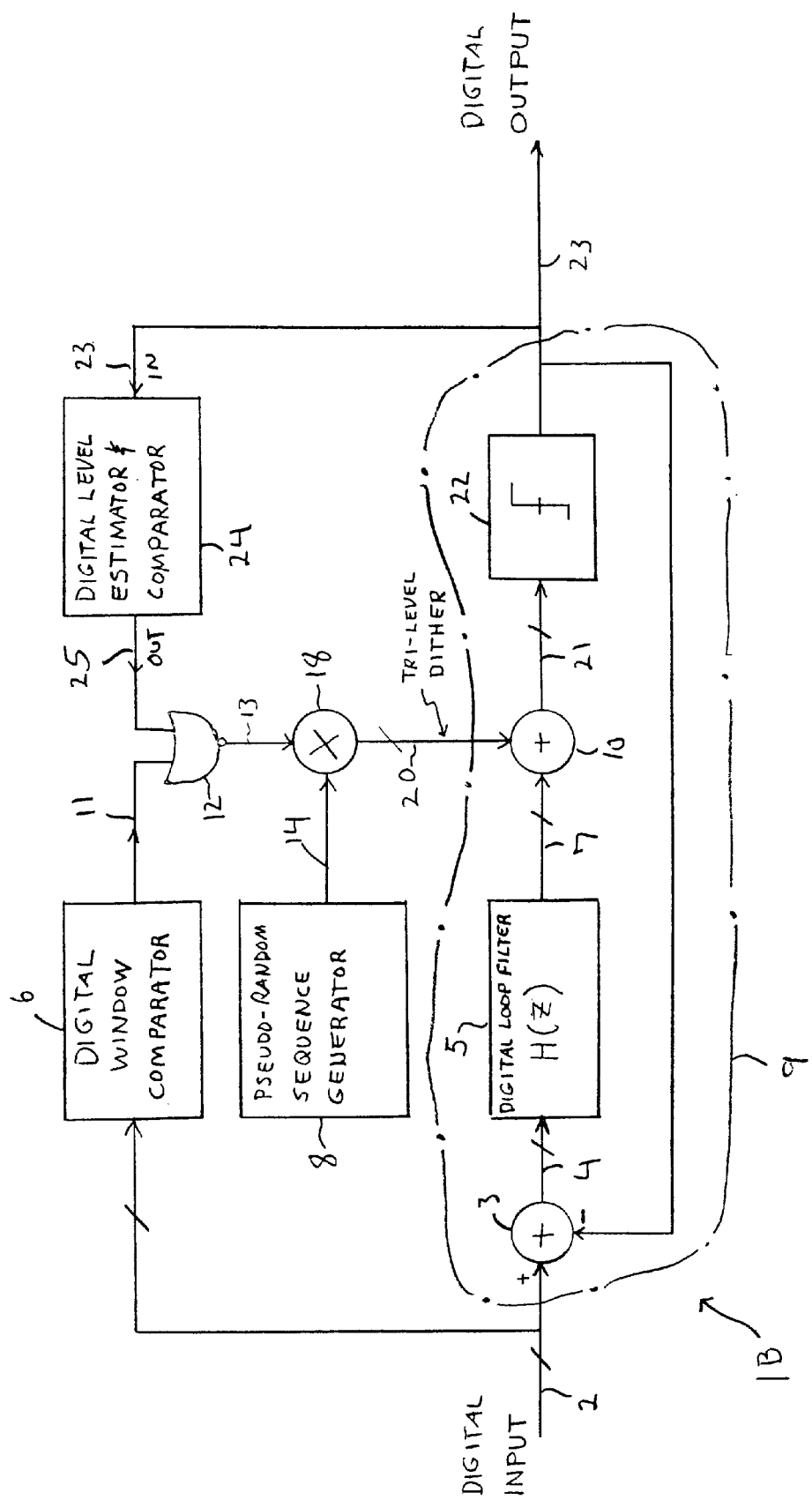

FIG. 3B discloses another delta sigma modulator system 1B which is very similar to the delta sigma modulator system of FIG. 3A, except that the analog summer 3, analog, filter 5, analog summer 10, and analog window comparator 6 as shown in FIG. 3A are digital rather than analog circuits in FIG. 3B. Delta sigma modulator 9 of FIG. 3B receives a digital input signal on digital input bus 2, which typically is a multi-bit bus that is connected to the (+) input terminals of a digital summer 3 and also to the input terminals of a digital window comparator circuit 6. Delta sigma modulator 1B produces a serial digital output stream on digital output bus 23, which typically is a multi-bit bus. Digital output bus 23 is connected to the output of a comparator or quantizer 22, an input of a digital level estimator and comparator circuit 24, and a (−) input of digital summer 3.

The output of digital summer 3 is connected to the input terminals of a digital filter circuit 5 having a transfer function H(z) and producing an output on bus 7. Digital window comparator 6 produces an output signal on conductor 11 indicative of whether the magnitude of the digital input signal on digital input bus 2 is within a range defined by digital window comparator 6. That signal is applied by conductor 11 to one input of a NOR gate 12, the other input of which is connected by conductor 25 to the output signal produced by digital level estimator and comparator circuit 24.

The output of NOR gate 12 is connected by dither enable/disable conductor 13 to one Input of a digital multiplier circuit 18. Digital multiplier circuit 18 has another input connected by conductor 14 to the one-bit output of a pseudo-random sequence generator circuit 8. The output terminals of digital multiplier 18 are connected by conductors 20 to apply a tri-level dither signal to one input of a digital adder 10, the other input of which is a connected by conductor 7 to the output of digital filter 5. The particular level of the tri-level dither signal which is applied to digital adder 10 is controlled by both the dither enable/disable signal V13 produced by NOR gate 12 and the pseudo-random sequence produced on conductor 14. The output of digital adder 10 is connected by conductor 21 to the input of quantizer 22, the output of which produces the one-bit digital output stream on digital output bus 23.

FIG. 8 illustrates the waveforms of pseudo-random sequence signal V14, dither enable/disable signal V13, and a dynamic dither signal DITHER produced on bus 20, all referenced to the clock signal CLK, for the embodiment of FIG. 3B. The signal DITHER in FIG. 8 represents the values of the dither signal encoded as a tri-level dither signal on multi-bit bus 20. For example, the high DITHER pulses indicated by numeral 58 in FIG. 8 could be encoded as a two-bit word 01, the zero level pulses indicated by numeral 59 could be encoded by the two-bit word 00, and the low dither pulses indicated by numerals 60 could be encoded by the two-bit word 11.

FIG. 4 illustrates an implementation of digital level estimator and comparator circuit 24 for either of FIGS. 3A and 3B. The input IN of digital level estimator and comparator circuit 24 receives the digital output signal on output conductor 23. Conductor 23 is connected to the input of a first delay element 27-1. The output of delay element 27-1 is connected by conductor 28-1 to the input of a second delay element 27-2, the output of which is connected by conductor 28-2 to the input of a subsequent delay element, and so forth, the last delay element 27-N having its output connected to conductor 28-N. The delay elements can be single-bit or multi-bit delay elements, the number of bits of the delay elements being commensurate with the number of bits of the delta sigma modulator. Conductors 28-1,2 . . . N constitute tap points of the serial shift register formed by delay element 27-1,2 . . . N, and are connected to inputs of a digital summer 30. The output of digital summer 30 is connected by conductor 31 to the (+) inputs of comparators 32 and 33. The (−) input of comparator 32 is connected to a threshold level +TH. The output of comparator 32 is connected by conductor 35 to one input of an ORing gate 37. The (−) input of comparator 33 is connected to receive an equal-magnitude but opposite polarity threshold −TH. The output of comparator 33 is coupled by an inverter 34 to conductor 36, the output of which is connected to the other input of ORing gate 37. The output of ORing gate is connected to the output 25 of digital level estimator and comparator 24. In FIG. 4, the number N of delay elements is 28 for one embodiment of the invention. Therefore, the signal on conductor 31 in FIG. 4 is a weighted average of the signal produced on the 28 tap points of the shift register or delay line formed by the 28 delay elements. Digital level estimator and comparator 24 thus functions as a low pass digital filter; its characteristic is indicated by the small graph shown in the lower right corner of FIG. 4.

In the delta sigma modulators of FIGS. 3A and 3B, the amplitude of the dither signal is constant. In accordance with the present invention, it is the density, rather than the amplitude, of the dither signal that is modulated or controlled according to the magnitude of the input signal applied to delta sigma modulators 1A and 1B. This eliminates the need to use a multi-bit DAC and/or a multi-bit ADC or quantizer as required by the above described prior art. It should be noted that in the most basic embodiments of the invention, the dither density modulation is achieved by using only the digital level estimator and comparator circuit 24 to determine whether the positive, negative, or zero value of the tri-level dither signal 20 should be added to the output of the filter 5.

Figure 5:
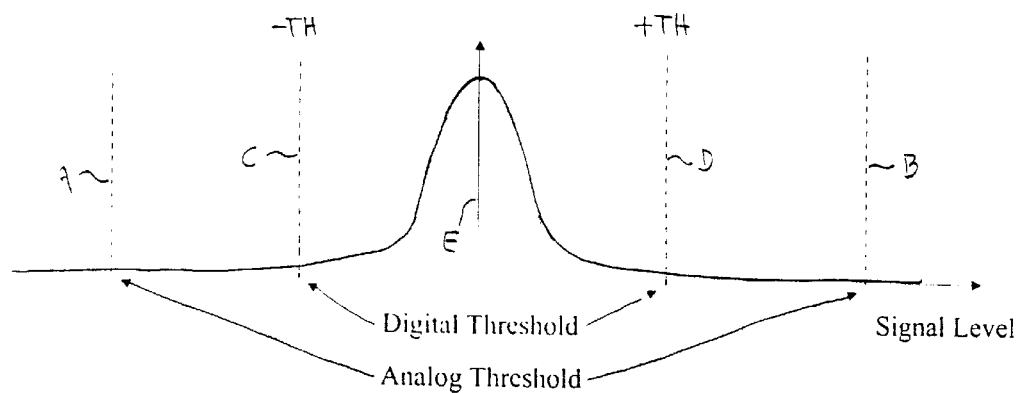
FIG. 5 is a curve showing the distribution of the signal produced at the output of digital level estimator and comparator circuit 24 of FIG. 3.

The output of the delta sigma modulator contains a high level of high frequency noise. A low pass digital filtering of the noise has to be performed in order to estimate the signal level of the output of the delta sigma modulator. The level of the output of the delta sigma modulator can be viewed as a coarse estimate of the level of the input signal being applied to the delta sigma modulator. After the low pass digital filtering has been performed by digital level estimator and comparator circuit 24, a lower level of noise remains at the output of the delta sigma modulator. The curve of FIG. 5 shows a typical distribution after the low pass digital filtering, i.e., the distribution at the output 25 of digital level estimator and comparator circuit 24 in FIGS. 3A and 3B. Note that the distribution curve shown in FIG. 5 corresponds to a low-magnitude input signal, with sample values centered around zero.

When the input signal of the delta sigma modulator 9 changes, the entire distribution function shown in FIG. 5 moves along with the mean value of the input signal. For example, when samples of the input signal applied to the delta sigma modulator 9 result in output samples which fall outside of the window established by the thresholds C and D of the window comparator 32,33 (FIG. 4) in digital level estimator and comparator circuit 24, that results in disabling injection of the positive and negative values of the tri-level dither signal on conductor or bus 20. If the samples of the delta sigma modulator output on digital output conductor or bus 23 fall within the window between C and D in FIG. 5, then the dither signal will be injected into the conventional delta sigma modulator 9 and will have values in accordance with the values of the pseudo-random sequence on conductor 14. As the amplitude of the input of the delta sigma modulator 9 increases, a higher percentage of the samples of the output of the delta sigma modulator 9 fall outside of the window between the levels C and D in FIG. 5. This causes the distribution curve shown in FIG. 5 to shift away (in the direction determined by the polarity of the input signal) from the zero level indicated by E, and this results in a gradual decrease in the density of non-zero values of the tri-level dither signal injected into the conventional delta sigma modulator 9.

Figure 1:
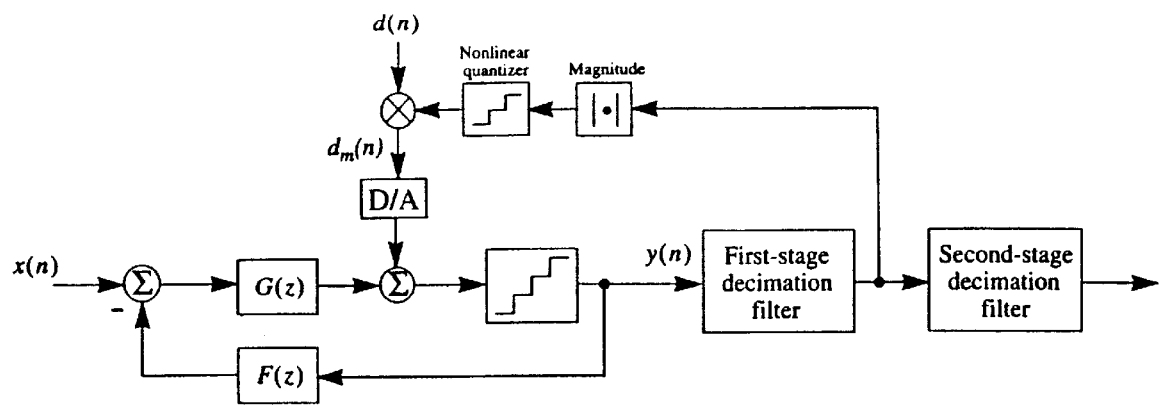
FIG. 1 is a block diagram of a prior art delta sigma A/D converter including dynamic dithering circuitry wherein an estimate of the input signal magnitude is determined digitally at the output of a first-stage decimation filter and utilized to control the magnitude of the dynamic dither.
Figure 2:
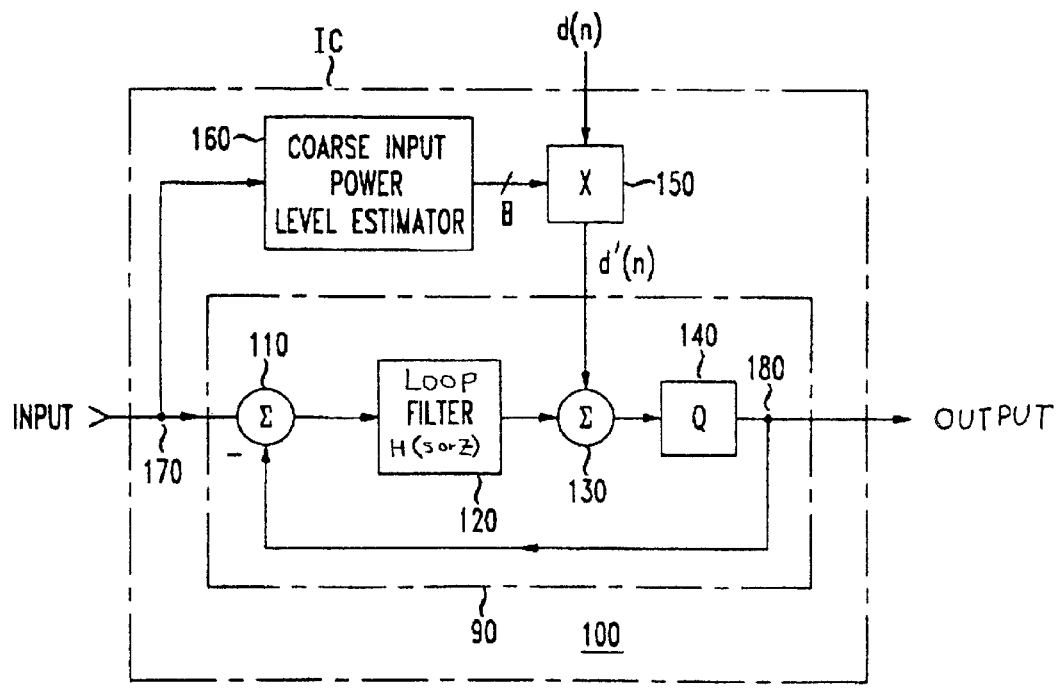
FIG. 2 is a block diagram of a prior art sigma-delta modulator wherein the magnitude of the dither is controlled in response to a course estimation of the magnitude of the input.
Figure 6:
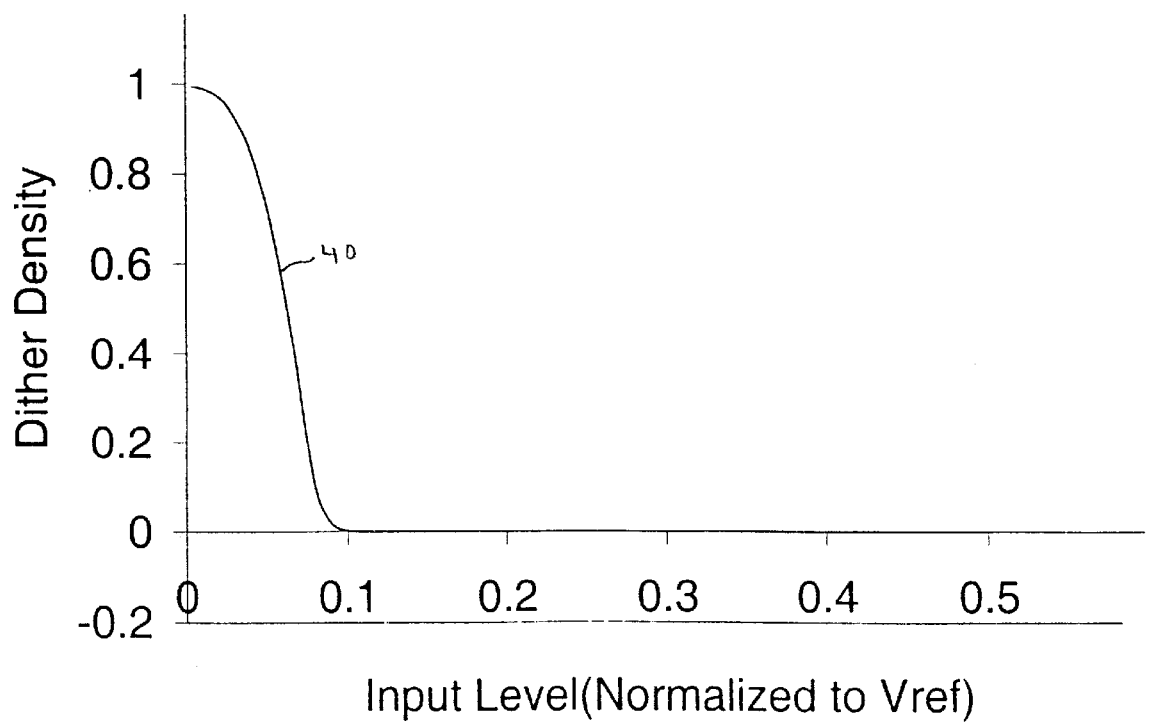
FIG. 6 is a graph of the dither density as a function of the normalized magnitude of the input of the delta-sigma modulator one of FIG. 3.

The curve 40 in the graph of FIG. 6 shows the gradually decreasing dither density produced by the above technique without any need for multiple arbitrary threshold levels as is required for the above described prior art dynamic dithering schemes shown in prior art FIGS. 1 and 2. It should be noted that the smooth transition 40 shown in FIG. 6 for the dither density as a function of the level of the input signal applied to delta sigma modulator 9 is created by the use of a portion of the noise inherent in the digital output on conductor 23 of delta sigma modulator 9.

Digital level estimator and comparator circuit 24 constitutes a simple digital filter that updates its output at every modulator clock cycle. Because of latency inherent in digital level estimator and comparator circuit 24, a number of clock cycles are required for the digitally filtered output noise signal produced on conductor 25 to respond to a change in the analog input signal applied to the delta sigma modulator and to the digital output signal produced on conductor 23.

There are various delta sigma modulator applications in which the magnitude of the input signal applied to the delta sigma modulator may undergo large, very fast transitions which result in instability or unstable circuit operation within the delta sigma modulator. For example, if a multiplexer coupled to the input of the delta sigma modulator is capable of switching any one of a number of different input signals of substantially different amplitudes to the input of the delta sigma modulator, and the user operates the multiplexer to switch from a very low amplitude input signal to a large amplitude input signal, an unstable condition is likely to be generated in the delta sigma modulator.

A very rapid change in the magnitude of the input signal applied to delta sigma modulator 9 from a very small value to a large value can cause a very high density of dither signals to be injected into the delta sigma modulator loop for a certain period of time while the large magnitude input signal is present. That can cause instability in the delta sigma modulator due to delay through the conventional delta signal modulator 9 and the digital level estimator and comparator circuit 24 unless the resulting high density of dither signals is rapidly "disabled". That is because the circuitry will continue to apply a high density of dither signals to the delta signal modulator 9 until the delay has ended. To prevent this from occurring, window comparator 6, which has no inherent latency, has its input connected to respond to the input signal if it exceeds a predetermined level, and produces a "dither disable" signal on conductor 11 which prevents the density-modulated dither signal on conductor 25 from being applied to the input 13 of digital multiplier 18 (i.e., one-bit DAC 18).

As shown in FIG. 5, the analog thresholds A and B are of greater magnitude than the digital thresholds C and D, so as to ensure the smooth change (indicated by curve 40 in FIG. 6) of the dither density as a function of the magnitude of the input signal applied to the delta sigma modulator. The threshold window between signal levels A and B in FIG. 5 needs to be larger than the window defined by output signal levels C and D to avoid disrupting the continuous changes in the density of the dither signal added to delta sigma modulator 9 as a function of the input signal magnitude. In a presently preferred embodiment of the invention, the width of the analog threshold window between A and B is double the width of the digital threshold window between C and D.

A larger value of the analog threshold window between A and B results in a smoother transition of the dither density, while a small value of the analog threshold window between A and B results in more stable operation in the feedback loop of the delta sigma modulator. The thresholds of the comparators 32 and 33 in digital level estimator and comparator 24 are selected so that if a very small magnitude input signal is being applied to the delta sigma modulator, then approximately 98 percent of the sample pulses produced on conductor 31 in FIG. 4 fall within the window defined by +TH and −TH. As the mean value of the input signal applied to delta sigma modulator 9 increases, the number of the output pulse samples produced on conductor 31 in FIG. 4 decreases.

Thus, the above described invention provides an inexpensive, highly stable delta sigma modulator 3A or 3B that minimizes troublesome baseband tones. This delta sigma modulator is suitable not only for audio applications, but for other industrial applications in which rapid, large magnitude analog or digital input signals must be converted, when the input signals can be DC coupled to the input of the delta sigma modulator. The described invention and avoids problems caused by arbitrary modulation of dynamic dither signals in response to very rapid, large amplitude changes in the input signal applied to the delta modulator. The need to use multi-level DACs and multi-level ADCs as in the prior art is avoided.

While the invention has been described with reference to several particular embodiments thereof, those skilled in the art will be able to make the various modifications to the described embodiments of the invention without departing from the true spirit and scope of the invention.

It is intended that all elements or steps which are insubstantially different or perform substantially the same function in substantially the same way to achieve the same result as what is claimed are within the scope of the invention:

What is claimed is:

1. Delta sigma modulator circuitry comprising:
    (a) a delta sigma modulator including
        i. a first summing circuit having a first input connected to receive an input signal,
        ii. analog loop filter circuitry having an input coupled to an output of the first summing circuit,
        iii. a second summing circuit having a first input coupled to an output of the analog loop filter circuitry, and
        iv. comparator circuitry having an input coupled to an output of the second summing circuit and also having an output coupled to an output of the delta sigma modulator circuitry; and
    (b) density-modulated dynamic dithering circuitry including
        i. a digital level estimator and comparator circuit having an input coupled to the output of the comparator, and
        ii. a one-bit digital-to-analog converter having a first input coupled to an output of the digital level estimator and comparator circuit, a second input coupled to receive a pseudo-random sequence signal, and an output applying a tri-level dither signal to a second input of the second summing circuit.

2. The delta sigma modulator circuitry of claim 1 including an analog window comparator circuit having an input coupled to receive the input signal and an ORing circuit having an output coupled to the first input of the one-bit digital-to-analog converter, a first input coupled to the output of the digital estimator and comparator circuit, and a second input coupled to an output of the analog window comparator circuit.

3. The delta sigma modulator of claim 2 wherein the ORing circuit includes a NOR gate.

4. The delta sigma modulator circuitry of claim 1 wherein the one-bit digital-to-analog converter includes a first switch having a first terminal coupled to a first reference voltage and a second terminal coupled to a first conductor, a second switch having a first terminal coupled to a zero reference voltage and a second coupled to the first conductor, a third switch having a first terminal coupled to a second reference voltage and a second terminal coupled to the first conductor, a fourth switch having a first terminal coupled to the first conductor and a second terminal coupled to the zero reference voltage, a capacitor having a first plate coupled to the first conductor and a second plate coupled to a summing conductor, and a fifth switch having a first terminal coupled to the summing conductor and a second terminal coupled to the zero summing conductor.

5. The delta sigma modulator circuitry of claim 4 wherein the first switch is controlled by a first signal to close the first switch to add a quantity of charge into the summing conductor if the pseudo-random sequence signal is at a first level and the output of the digital level estimator and comparator circuit indicates that the output of the delta sigma modulator is within a first threshold window established by a Comparator of the digital level estimator and comparator circuit, the second switch is controlled by a second signal to close the second switch to avoid addition or subtraction of charge into or from the summing conductor if the output of the digital level estimator and comparator circuit indicates that the output of the delta-sigma modulator is outside of the first threshold window, and the third switch is controlled by a third signal to close the third switch to subtract a quantity of charge from the summing conductor if the pseudo-random sequence signal is at a second level and the output of the digital level estimator and comparator circuit indicates that the output of the delta sigma modulator is within the first threshold window.

6. The delta modulator circuitry of claim 1 wherein the digital level estimator and comparator circuit includes:
   i. a plurality of delay elements serially connected to form a delay line, each delay element having an input terminal and an output terminal, the input terminal of a first delay element being coupled to the output of the first summing circuit;
   ii. the digital summing circuit having a plurality of inputs coupled to the outputs of the plurality of delay elements, respectively, the digital summing circuit having an output carrying a digital signal representing an average of the output signals of the plurality of delay elements;
   iii. a window comparator circuit coupled to receive the output of the digital summing circuit and operable to produce an output signal which has a probability distribution that is a function of both the input signal received by the first summing circuit and noise contained in an output signal produced on the output of the delta sigma modulator.

7. The delta sigma modulator circuitry of claim 6 wherein the window comparator circuit includes the first comparator having a first input coupled to the output of the digital summing circuit and a second input coupled to a positive first threshold voltage, and the second comparator having a first input coupled to the output of the digital summing circuit and a second input coupled to a negative second threshold voltage, an inverter having an input coupled to an output of the second comparator, and an ORing circuit having an output on which the output signal is produced.

8. Delta sigma modulator circuitry comprising:
   (a) a delta sigma modulator including
      i. a first summing circuit having a first input connected to receive an input signal,
      ii. loop filter circuitry having an input coupled to an output of the first summing circuit,
      iii. a second summing circuit having a first input coupled to an output of the loop filter circuitry,
      iv. comparator circuitry having an input coupled to an output of the second summing circuit and also having an output coupled to an output of the delta sigma modulator circuitry; and
   (b) density-modulated dynamic dithering circuitry including
      i. a digital level estimator and comparator circuit having an input coupled to the output of the comparator circuitry, and
      ii. digital multiplier circuitry having a first input coupled to an output of the digital level estimator and comparator circuit, a second input coupled to receive a pseudo-random sequence signal, and an output applying a tri-level dither signal to a second input of the second summing circuit.

9. The delta sigma modulator circuitry of claim 8 including an analog window comparator circuit having an input coupled to receive the input signal and an ORing circuit having an output coupled to the first input of the digital multiplier circuit, a first input coupled to the output of the digital estimator and comparator circuit, and a second input coupled to an output of the window comparator.

10. A method of providing dither to a delta sigma modulator system comprising:
   (a) providing a delta sigma modulator including a first summing circuit having a first input connected to receive an input signal, loop filter circuitry having an input coupled to an output of the first summing circuit, a second summing circuit having a first input coupled to an output of the loop filter circuitry, and comparator circuitry having an input coupled to an output of the second summing circuit and also having an output coupled to an output of the delta sigma modulator;
   (b) adjusting the density of the dither in accordance with changes in the magnitude of the input signal by performing a coarse digital filtering of an output signal produced by the delta-sigma modulator, wherein noise present in the output signal produced by the delta sigma modulator causes a probability distribution of the occurrence of pulses constituting a filtered output signal produced by the coarse filtering;
   (c) determining if pulses of the filtered output signal are within a first threshold window and producing a dither disable signal if the filtered output signal is not within the first threshold window; and
   (d) enabling a pseudo-random sequence signal so as to produce a non-zero dither signal level and applying it to the second input of the second summing circuit.

11. The method of claim 10 including performing the coarse digital filtering to produce the probability distribution so as to cause gradual transitions in the density of pulses produced by the coarse filtering.

12. The method of claim 11 including performing the coarse digital filtering outside of a signal path utilized to provide a final output of the delta sigma modulator circuitry.

13. The method of claim 12 including performing the coarse digital filtering by utilizing a digital filter that is updated during every clock cycle of the delta sigma modulator.

14. A method of providing dither to a delta sigma modulator system comprising:

(a) providing a delta sigma modulator including a summing circuit having a first input connected to receive an input signal, loop filter circuitry having an input coupled to an output of the summing circuit, and comparator circuitry having an input coupled to an output of the loop filter circuitry and also having an output coupled to an output of the delta sigma modulator;

(b) adjusting the density of the dither in accordance with changes in the magnitude of the input signal by performing a coarse digital filtering of an output signal produced by the delta-sigma modulator, wherein noise present in the output signal produced by the delta sigma modulator causes a probability distribution of the occurrence of pulses constituting a filtered output signal produced by the coarse filtering;

(c) determining if pulses of the filtered output signal are within a first threshold window and producing a dither disable signal if the filtered output signal is not within the first threshold window; and (d) enabling a pseudo-random sequence signal so as to produce a non-zero dither signal level and applying it to a summing node of the delta-sigma modulator.

15. The method of claim 14 including performing the coarse digital filtering to produce the probability distribution so as to cause gradual transitions in the density of pulses produced by the coarse filtering.

16. The method of claim 15 including performing the coarse digital filtering outside of the signal path utilized to provide a final output of the delta sigma modulator circuitry.

17. The method of claim 16 including performing the coarse digital filtering by utilizing a digital filter that is updated during every clock cycle of the delta sigma modulator.

18. A delta sigma modulator system comprising:

(a) a delta sigma modulator including a first summing circuit having a first input connected to receive an input signal, loop filter circuitry having an input coupled to an output of the first summing circuit, a second summing circuit having a first input coupled to an output of the loop filter circuitry, and comparator circuitry having an input coupled to an output of the second summing circuit and also having an output coupled to an output of the delta sigma modulator circuitry;

(b) means for performing a course digital filtering of an output signal produced by the delta-sigma modulator;

(c) means for determining if pulses of the filtered output signal are within a first threshold window and producing a dither disable signal if the filtered output signal is not within the first threshold window; and (d) means for enabling a pseudo-random sequence signal so as to produce a non-zero dither signal level and applying it to the second input of the second summing circuit.

19. A delta sigma modulator system comprising:

(a) a delta sigma modulator including a first summing circuit having a first input connected to receive an input signal, loop filter circuitry having an input coupled to an output of the first summing circuit, a second summing circuit having a first input coupled to an output of the loop filter circuitry, and comparator circuitry having an input coupled to an output of the second summing circuit and also having an output coupled to an output of the delta sigma modulator circuitry;

(b) a course digital filtering circuit having an input coupled to receive an output signal produced by the delta-sigma modulator;

(c) comparator circuitry for determining if pulses produced by the course digital filtering circuit are within a first threshold window;

(d) circuitry coupled to an output of the comparator circuitry to produce a dither disable signal if the filtered output signal is not within the first threshold window; and (e) a multiplier circuit having a first input coupled to receive the dither disable signal in the second input receiving a pseudo-random sequence signal and operative to produce a non-zero dither signal level if the dither disable signal is at a first level and applying the non-zero dither signal level to the second input of the second summing circuit, and operative to produce a zero dither signal level if the dither disable signal is at a second level and applying the zero dither signal level to the second input of the summing circuit.

20. The delta sigma modulator system of claim 19 wherein the first and second summing circuits are analog summing circuits, and the loop filter circuitry includes analog loop filter circuitry.

21. The delta sigma modulator system of claim 19 wherein the first and second summing circuits are digital summing circuits, and the loop filter circuitry includes digital loop filter circuitry.

* * * * *